(12) United States Patent
Doerr et al.

(10) Patent No.: US 6,240,118 B1
(45) Date of Patent: May 29, 2001

(54) MULTICHANNEL LASER TRANSMITTER WITH A SINGLE OUTPUT PORT

(75) Inventors: Christopher Richard Doerr, Middletown; Charles H. Joyner, Red Bank, both of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/192,697

(22) Filed: Nov. 16, 1998

(51) Int. Cl.[7] .................. H01S 3/10; H01S 3/03; G02B 6/26; G02B 6/34
(52) U.S. Cl. .................. 372/64; 372/20; 372/26; 385/15; 385/17; 385/37; 385/46
(58) Field of Search .................. 385/15, 17, 24, 385/37, 46; 372/20, 26, 29, 64, 69, 70

(56) References Cited

U.S. PATENT DOCUMENTS

| | | | |
|---|---|---|---|
| 5,136,671 | * 8/1992 | Dragone | 385/46 |
| 5,339,157 | * 8/1994 | Glance et al. | 385/24 |
| 5,396,507 | * 3/1995 | Kaminow et al. | 372/20 |
| 5,412,744 | * 5/1995 | Dragone | 385/24 |
| 5,524,014 | * 6/1996 | Kaminow et al. | 372/28 |
| 5,623,571 | * 4/1997 | Chou et al. | 385/130 |
| 5,881,199 | * 3/1999 | Li | 385/140 |
| 5,987,050 | * 11/1999 | Doerr et al. | 385/108 |
| 6,014,390 | * 1/2000 | Joyner | 372/20 |
| 6,049,640 | * 4/2000 | Doerr | 958/15 |

OTHER PUBLICATIONS

"An 8 channel digitally tunable transmitter with electroabsorbtion modulated output by selective–area epitaxy" IEEE Phot. Tech. Let. vol. 7, No. 9, Sep. 1995 pp. 1013–1015 by Joyner et. al.

"Optimum design of a planar array of tapered waveguides," published in J.Opt.Soc. Am. A, vol. 7, No. 11, Nov. 1990 by C. Dragone.

U.S. application No. 09/016,176, Joyner et al., filed Jan. 30, 1998.

* cited by examiner

Primary Examiner—Robert H. Kim
Assistant Examiner—Armando Rodriguez
(74) Attorney, Agent, or Firm—John A. Caccuro

(57) ABSTRACT

A multichannel laser is based on an interleaved chirped waveguide grating router. An interferometric modulator is incorporated inside a laser cavity by means of a waveguide grating router and enables independent modulation of any of the wavelengths of the multichannel laser. The interferometric modulator operates independently of the wavelength selection elements of the waveguide grating router used to select the wavelengths of the multichannel laser.

19 Claims, 6 Drawing Sheets

MULTICHANNEL LASER TRANSMITTER WITH A SINGLE OUTPUT PORT

CROSS-REFERENCE TO RELATED APPLICATION

Related subject matter is disclosed in the concurrently filed application entitled "LASER TRANSMITTER BASED ON A COUPLER AND HAVING A SEPARATE OUTPUT PORT" by the same inventors, C. R. Doerr and C, H. Joyner, both applications being assigned to the same Assignee.

TECHNICAL FIELD OF THE INVENTION

This invention relates to lasers and, more particularly, to a multichannel laser having a single output port, as well as an improved method of controlling the output of optical signals from a multichannel laser.

BACKGROUND OF THE INVENTION

To make optimal use of the bandwidth available in a fiber based network, it is desirable to use as many separately detectable wavelength channels as possible and to encode data onto each wavelength at as high a speed as possible. One problem with lasers that deliver multiple channels is that the cavity length for many of them is long, making direct modulation above 1 GHz impractical due to the round trip time of a photon in the cavity. A possible solution is to use an output power tap on the main laser cavity and to modulate this output while the main laser cavity runs in continuous wavelength mode. (see C. H. Joyner et. al. "An 8 channel digitally tunable transmitter with electroabsorbtion modulated output by selective-area epitaxy" PTL vol. 7, no.9, September 1995 pp. 1013–1015 or the pending patent application entitled "Improved tunable transmitter with Mach-Zehnder Modulator," Ser. No. 09/016,176, filed on Jan. 30, 1998 by C. H. Joyner. In both of the above cases the modulator was external to the laser cavity.

For improved modulation rates at low drive levels, it is desired is to integrate a phase modulator capability into a laser transmitter. Moreover, in WDM applications it would also be desirable to combine a number of these integrated modulated lasers together into a single multichannel modulated laser.

SUMMARY OF THE INVENTION

In accordance with the present invention, a multichannel laser is based on an interleaved chirped waveguide grating router. An interferometric modulator is incorporated inside a laser cavity by means of a waveguide grating router and enables independent modulation or switching of any of the wavelengths of the multichannel laser. The interferometric modulator operates independently of the wavelength selection elements of the waveguide grating router used to select the frequencies of the multichannel laser.

More particularly, in accordance with the present invention, a multichannel laser comprises a waveguide grating router including a first star coupler, a second star coupler, and three interleaved sets of m waveguide grating arms (where m is a number greater than one) interconnecting to a first side of the first and second star couplers, for producing n wavelengths in the multichannel laser (where n is a number greater than one). A second side of the first coupler includes a first connection to a reflecting surface, and a second connection to an output port. A second side of said second coupler includes a first group of n connected waveguides, each of the n waveguides connected through an optical amplifier to a reflecting surface, a second group of n connected waveguides, each of the n waveguides connected through an optical amplifier and a controllable phase shifter to a reflecting surface. A laser signal is generated in each of n cavities formed by one of the first group of waveguides, the first and second couplers, the group of m waveguide grating arms, and the first connection of said first coupler. The magnitude of each of the n laser signals appearing at the output port are controlled by the optical amplifier and phase shifter in each one of the second group of n connected waveguides.

DETAILED DESCRIPTION

In the following description, each item or block of each figure has a reference designation associated therewith, the first number of which refers to the figure in which that item is first described (e.g., 101 is first described in FIG. 1).

Figure 1:
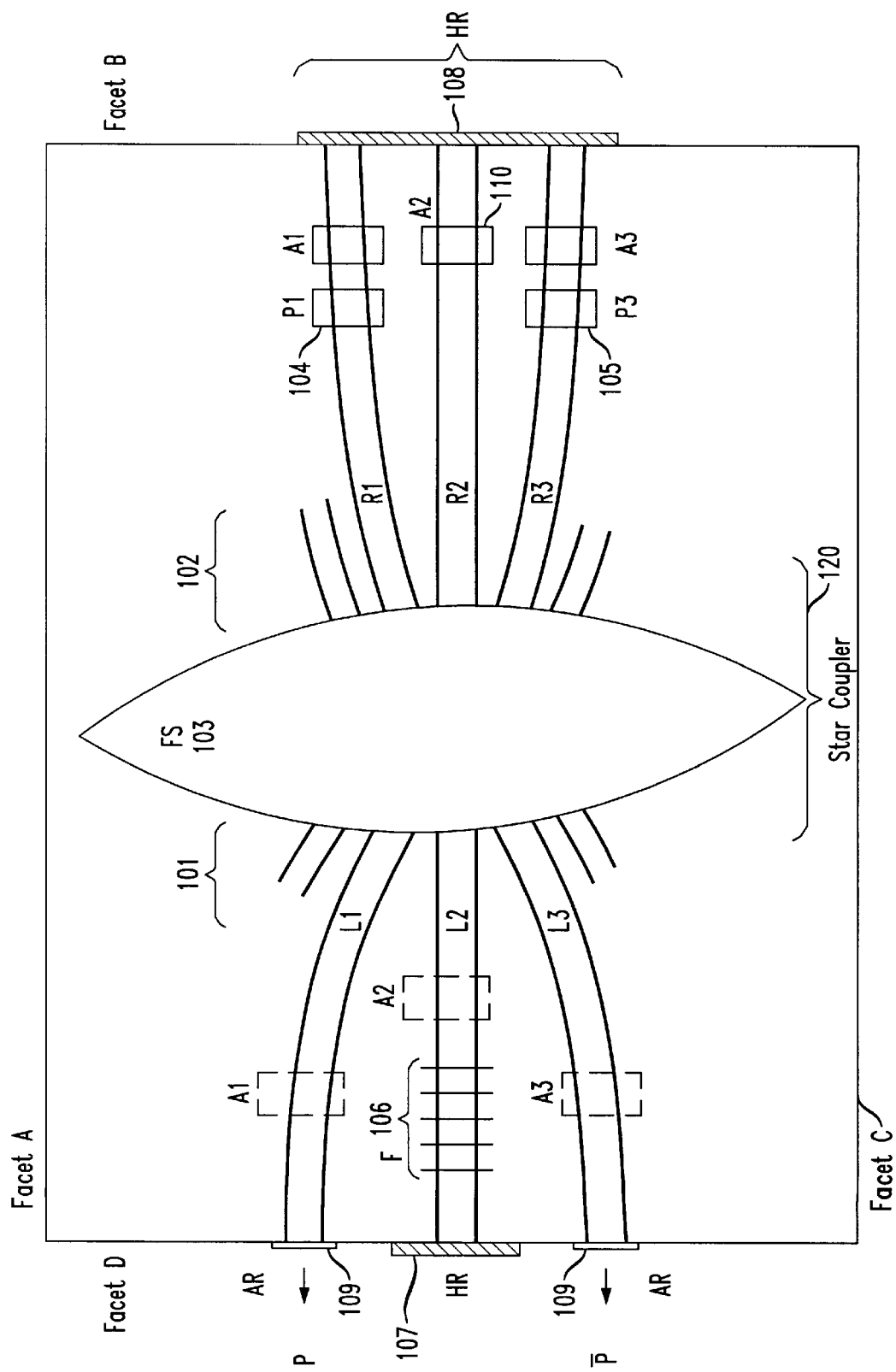
FIG. 1 shows, in accordance with the present invention, an illustrative block diagram of an illustrative 3 by 3 star coupler laser transmitter for providing a single wavelength output.

The basic schematic of a 3 by 3 coupler is shown in FIG. 1. The invention includes a star coupler 120 in which the input and output arms (or waveguides) to the left 101 and right 102 of the free-space region [FS] 103 are symmetrically spaced. A wavelength $\lambda_x$ signal exiting any of the waveguides R1–R3 is radiated into the free space region 103 and arrives somewhat equally at the waveguides L1–L3. If the phase of the wavelength $\lambda_x$ signal from each of the waveguides R1–R3 are all equal, then all of the wavefronts constructively combine at the entrance to waveguides L1–L3. If, however, the phase of the wavelength $\lambda_x$ signal from each of the waveguides R1–R3 are not the same then some destructive combining of the wavefronts occurs at waveguides L1–L3. As will be discussed in a later paragraph, the amount of destruction depends on the phase difference between the wavefronts radiated from the waveguides R1–R3. The laser signal generated in the arrangement of FIG. 1 will operate in a single transverse mode if the width and height of the cavity elements are restricted to a size that will not support multimode operation.

If the star coupler 120 input (left) and output (right) arms 101 and 102 are strongly coupled, the efficiency of the 3 by 3 coupler of FIG. 1 is increased. This occurs when the mode profile of each waveguide (e.g., R2, L2) overlaps strongly with the mode profile of its adjacent neighbors (i.e., R1, R3 and L1, L3, respectively). In this manner, wavefronts are created in adjacent waveguides as the waveguides enter the free-space region even though the laser signal may only have been injected into a single waveguide at some distance from the free-space region where the mode profile of the adjacent waveguides did not overlap. Thus, for example a wavelength $\lambda_x$ signal originating on waveguide R2, at some distance from the free-space region 103, becomes coupled to waveguides R1 and R3 near the free-space region 103 and the wavefronts of wavelength $\lambda_x$ would then exit from each of R1–R3 into the free-space region 103. The star coupler 120 can be implemented as described in the article by C. Dragone entitled "Optimum design of a planar array of tapered waveguides," published in J. Opt. Soc. Am. A, Vol. 7, No.11, November 1990 and incorporated by reference herein.

The waveguides R1, R2, and R3 to the right of FS 103 terminate at facet B that has a high reflection HR coating 108. Each of these arms R1–R3 contains an amplifier section, A1–A3, for gain and/or control of the optical power amplitude in that waveguide. The waveguides R1 and R3 also contain phase adjustment elements, P1 and P3, which allow the optical phase of that arm to be adjusted either by application of current or voltage signal 104 and 105, respectively, to P1 and P3. To the left of FS unit 103, waveguides arms L1 and L3 terminate, respectively, at output ports p and p-bar at facet D, which has an antireflection AR coating. Waveguide L2 contains a wavelength selective element 106 to choose a single wavelength among those allowed by the gain spectrum of the amplifier sections A1–A3. This element, while illustratively represented schematically as a grating, may also be a waveguide grating router, a coupler, filter or any other optical element used to select wavelength. The main CW laser cavity is defined by the HR mirror 107 on facet D, on the left, wavelength selective element 106, waveguide L2, FS 103, waveguide R2, amplifier A2, and the HR mirror 108 on the right. The amplifier A2, and hence the laser signal from the transmitter, can be turned on and off via lead 110.

The free-space region FS 103 and the associated waveguides to the right and left, R1–R3 and L1–L3, behave as a 3×3 coupler. The relationships for conservation of optical power as a function of amplitude and phase among the 6 ports for a lossless star coupler are given by the following equations:

$$L = AR \text{ with } A = A^{-1}$$

Where L is a vector denoting the power in waveguides L1, L2 and L3. The variable R is a vector denoting the power in waveguides R1, R2, and R3. A is the matrix of coefficients denoting the phase relationship between vectors R and L given by $$A = 1/\sqrt{3} \begin{bmatrix} -1/2 - j\sqrt{3}/2 & 1 & -1/2 + j\sqrt{3}/2 \\ 1 & 1 & 1 \\ -1/2 + j\sqrt{3}/2 & 1 & -1/2 - j\sqrt{3}/2 \end{bmatrix}$$

$$= 1/\sqrt{3} \begin{bmatrix} e^{-\pi j 2/3} & 1 & e^{-\pi j 2/3} \\ 1 & 1 & 1 \\ e^{+\pi j 2/3} & 1 & e^{-\pi j 2/3} \end{bmatrix}$$

Figure 2:
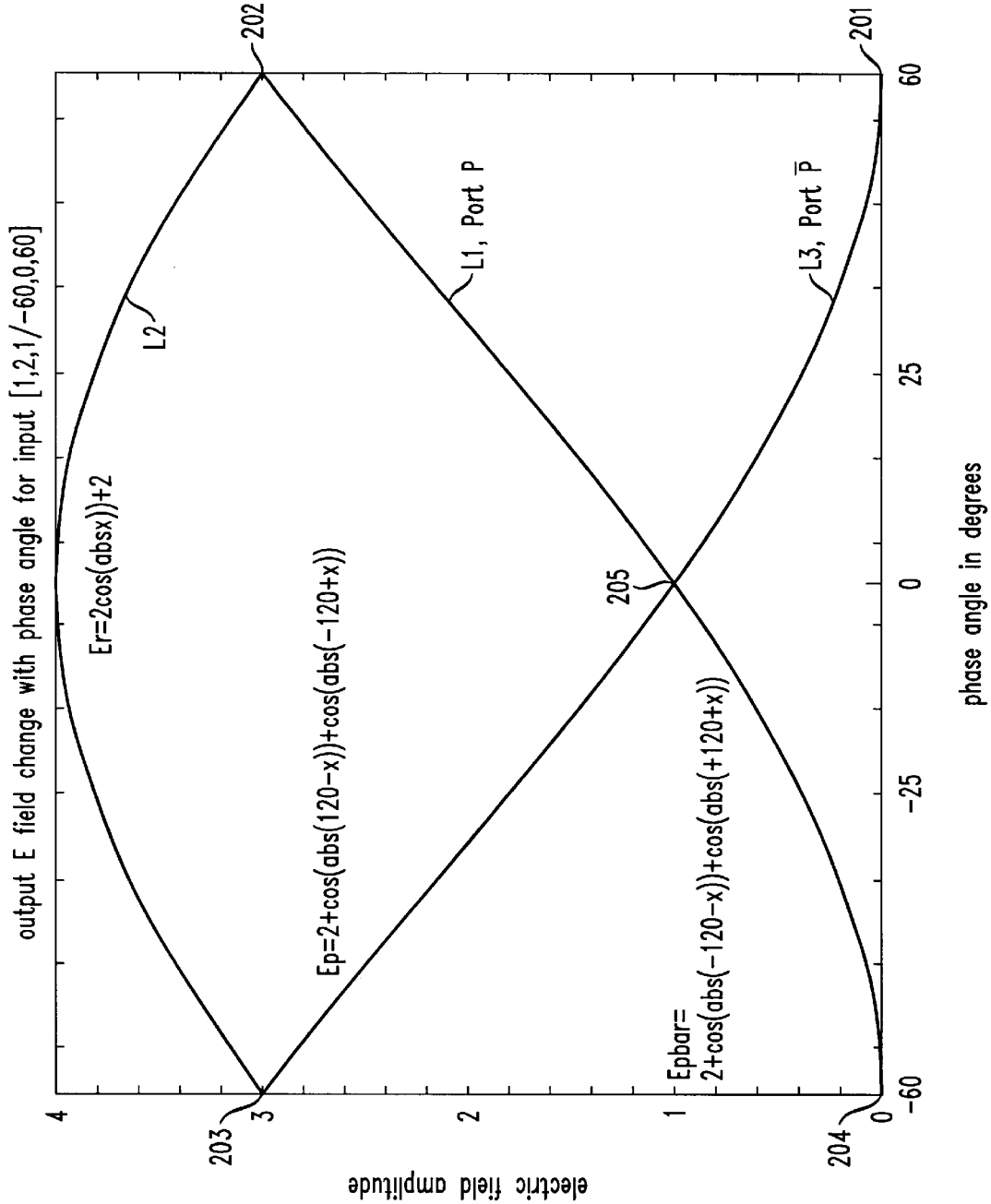
FIG. 2 shows a plot of the electric field amplitudes over a range of phase shifts at all three ports.

With reference to FIG. 2, there is shown the variation in electric field magnitudes |Er|, |Ep|, and |Epbar| (in the waveguides L1; L2; and L3, respectively, of FIG. 2) with changes in the phase shifts in the arms R1 and R3 relative to the phase in arm R2. As shown, for example, if the power density in arm R2 is twice that in arms R1 and R3 and the phase of the electric field vector in waveguide R1 is rotated −60° relative to R2 while the phase in R3 is rotated +60° relative to R2, then no power emerges from waveguide L3 at port p-bar, 201. However, 9⁄16 of the power density ($Ep^2$) in arm L2 will emerge from arm L1 at port p, 202. If the sign of the phase shifts is reversed for arms R1 and R3 via the phase shifters P1 and P3 respectively, then this condition will reverse and power will be delivered to port p-bar, 203, while none will emerge from port p, 204. Thus for the described initial power densities, a phase shift swing of +/−60° will drive the device to modulate (or switch) power between ports p and p-bar. This is to be compared to a conventional extra-cavity Mach-Zehnder interferometer modulator, which requires +/−90° of phase shift.

It should be noted that the electric field amplitudes that exist over a range of phase shifts for all three ports are shown in FIG. 2. Thus, when the relative phase in R3 is zero and the relative phase in R1 is zero, the electric field from ports p and pbar are both 1 unit, 205, or 1⁄16 of the power of the laser. In this manner it is possible to get equal and complementary outputs at the output ports p and p-bar of the laser transmitter of FIG. 1. There are many other solutions to the set of the above- described transcendental equations. We note that in general the voltage or current required, on control leads 104 and 105, to produce a phase change in phase shifters P1 and P3 of FIG. 1, via an index change, is modest so that such a device is particularly suited to high speed operation.

Figure 3:
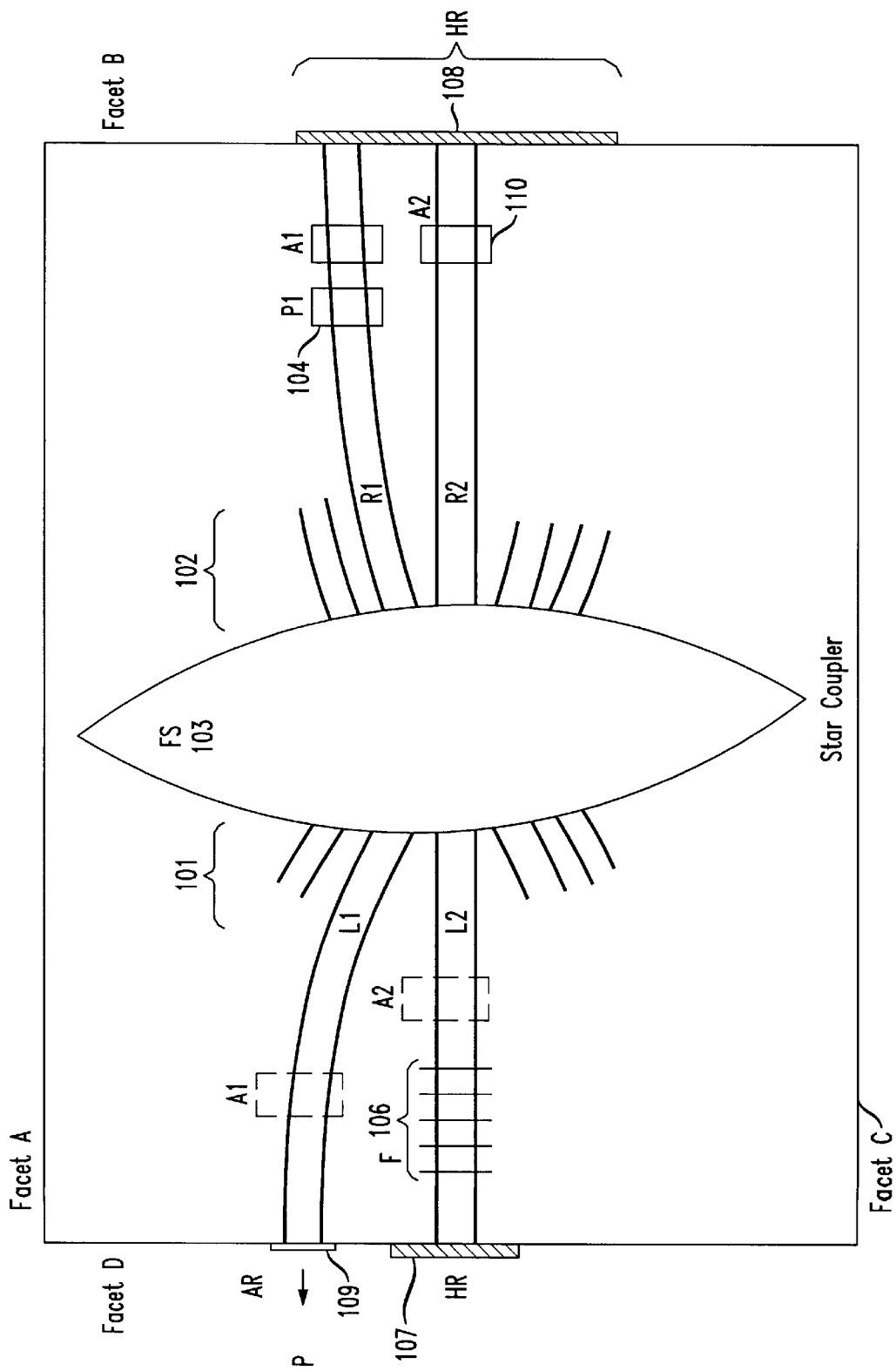
FIG. 3 shows, in accordance with the present invention, a more general illustrative 2 by 2 star coupler laser transmitter for providing a single wavelength output.

We also note that when the complementary output signal, p-bar, is not required then the device can also be constructed from a 2×2 star coupler with less efficiency. This is shown in FIG. 3 where the arms R3 and L3, phase shifter P3 and amplifier A3 have been removed.

Returning to FIG. 1, It should be noted that it is also possible to construct the same functionality with higher order n by n couplers with even greater efficiency at the expense of having n phase shifting elements P and n amplifiers A to control. It is also possible to direct arm L1 to facet A and arm L3 to facet C, if it is desired to have each facet entirely of one reflectivity type. The Facets B and D are reflective or highly reflective HR, while facets A and C are anti-reflective AR. In principle any of the active elements Pn or An can be located anywhere in arms Ln or Rn (e.g., see the dotted elements A1–A3, P1 and P3 in FIG. 1). However, when a phase shifter element P1, P3 is located in arms L1, L3, the phase shift must be twice the value when these phase elements are located in the arms R1, R3. This is because when P1, P3 are in arm R1, R3, the signal traverses in one direction through P1, P3 and is then reflected back through P1, P3 in the opposite direction. The same situation occurs for an amplifier An in arms L1, L3, i.e., it must also be twice the gain of an amplifier An that is placed in arms R1, R3. Wavelength selector F 106 may also be located in waveguide R2 instead.

In WDM network applications it is desirable to produce a number of modulated lasers signals as cheaply and cost effective as possible. While the FIG. 1 and 2 modulated laser transmitters offer an improvement over prior modulated laser transmitters, they still only operate on one wavelength at a time. What is desired in WDM systems is to generate multiple wavelengths simultaneously on the same device.

Figure 4:
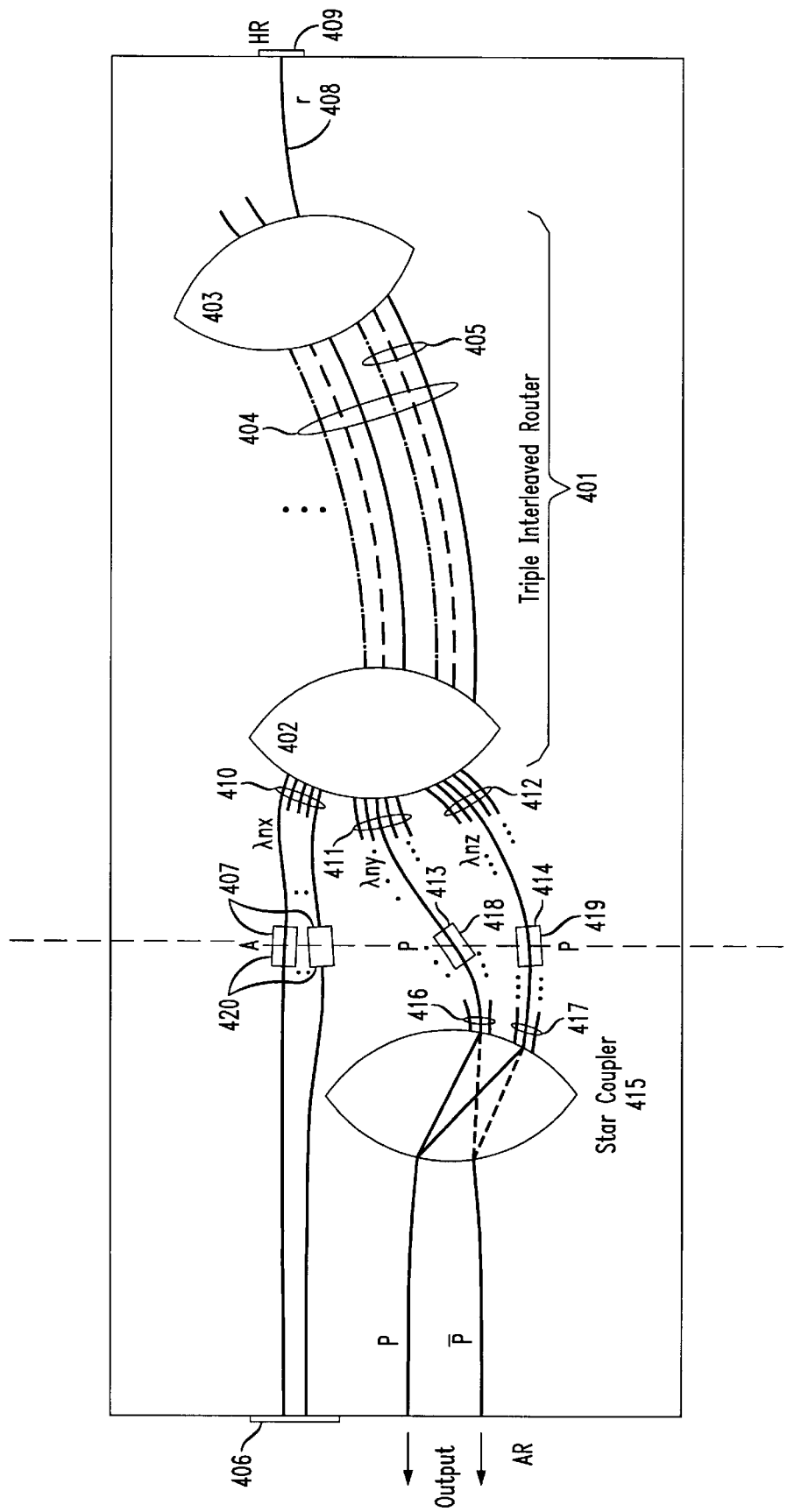
FIG. 4 shows a first embodiment of a multichannel transmitter with a single output port.

In accordance with the present invention, we have combined the function of a 3×3 star coupler (of FIG. 1) with a interleaved-chirped wavelength selection element in a compact way to produce a multichannel transmitter with a single output port, where all the channels are independently modulated at high speed. One embodiment of this arrangement is shown in FIG. 4. As shown, a triple interleaved- chirped waveguide grating router 401 including two star couplers 402 and 403 interconnected by an array of waveguide arms 404. The interleaved-chirped waveguide grating router 401 has waveguide arms 404 that are divided into groups of three arms 405. In each group of three waveguides 405, every third arm is given an additional path length of $\lambda_c/3$, while the other two waveguide grating arms in each group remain the same length as for a conventional waveguide grating router.

Such a triple interleaved router is described in the pending U. S. patent application entitled "Wavelength-Division-Multiplexing Cross-Connect using Angular Dispersive Elements and Phase Shifters" by C. R. Doerr, Ser. No. 08/923,304, filed on Sep. 4, 1997 and incorporated by reference herein. This patent application describes a technique for implementing a WDM cross-connect using two "interleaved-chirped" waveguide grating routers interconnected by controllable phase shifters, the description of which is incorporated by reference herein.

Figure 5:
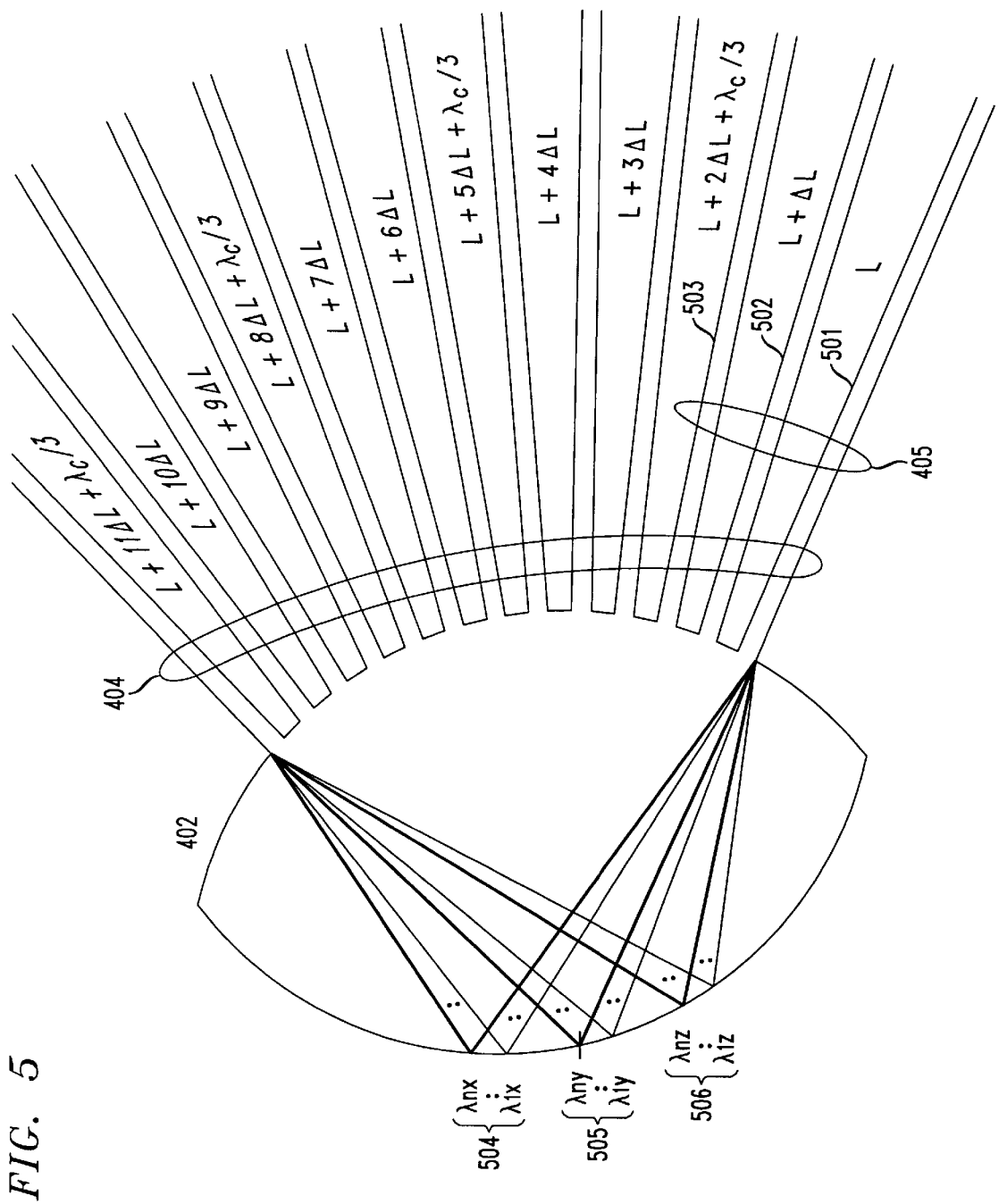
FIG. 5 shows a star coupler with an array of waveguide arms which are triple interleaved and chirped.

With reference to FIG. 5 there is shown, illustratively, the star coupler 402 and the length of each arm in the array of waveguide arms 404. In group 405, the length of the first two arms 501 and 502 have the conventional length, while the third arm 503 has an extra length $\lambda_c/3$, where $\lambda_c$ is the desired laser wavelength This pattern is repeated in the other groups of arms in 404. This triple interleave chirp produces three primary Brillouin image zones 504–506, for each of the group of wavelengths $\lambda_{1x}-\lambda_{nx}$, $\lambda_{1y}-\lambda_{ny}$, and $\lambda_{1z}-\lambda_{nz}$, that are radiated from each of the waveguides 404. Note that a separate image is formed for each different wavelength in each image zone 504–506. Returning to FIG. 4, each of the wavelengths in the groups $\lambda_{nx}$, $\lambda_{ny}$, and $\lambda_{nz}$ travels over a separate waveguide in the groups 410, 411, and 412, respectively.

In FIG. 4, a laser for each wavelength $\lambda_n$ is formed using a laser cavity that includes HR 406, amplifier 407, a waveguide of group 410, star coupler 402, the waveguides 404, star coupler 403, path r 408, and HR 409. In this manner, the path between port r and ports nx comprise the n carrier wave (CW) lasing cavities for the n wavelengths $\lambda_n$. Powering amplifier A in arm nx, via lead 420, turns on the associated laser wavelength $\lambda_n$. Each of the n wavelengths in $\lambda_{ny}$, and $\lambda_{nz}$ also has its own output port in groups 411 and 412, respectively, as well as its own phase shifter, 413 and 414, respectively. Star coupler 415 is a 2n by 2 coupler which couples each of the wavelengths $\lambda_{ny}$ in waveguide group 416 and $\pi_{nz}$ in waveguide group 417 to either output p or p-bar under control of control signals 418 and 419. The operation of star coupler 415 and phase shifters 413 and 414 is the same as that previously described for FIG. 1.

Figure 6:
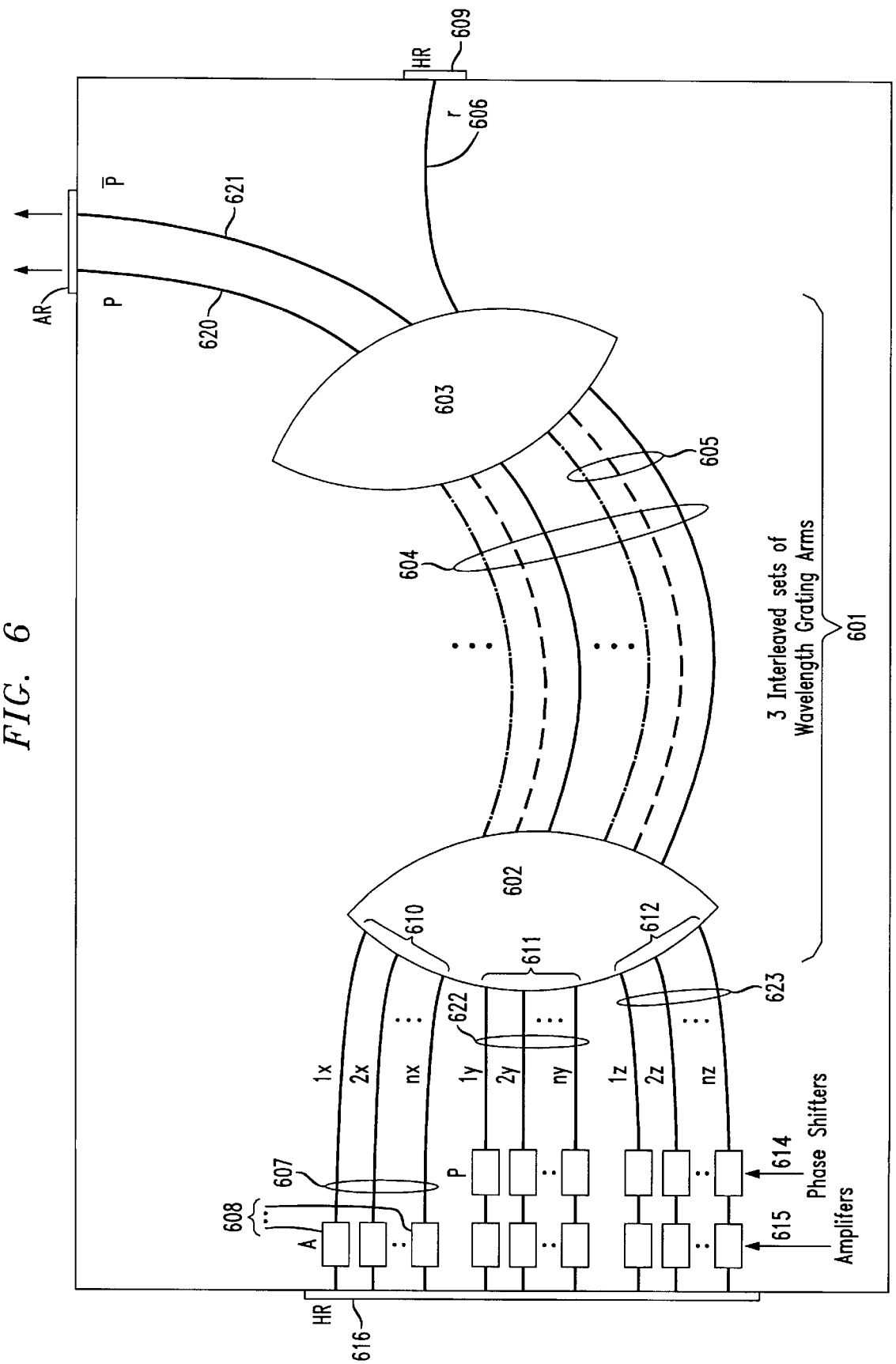
FIG. 6 shows, in accordance with the present invention, an illustrative diagram of a multichannel transmitter with a single output port where all the channels are independently modulated at high speed.

Shown in FIG. 6 is a preferred embodiment of our multichannel transmitter with a single output port. As shown, a triple interleaved-chirped waveguide grating router 601 includes two star couplers 602 and 603 interconnected by an array of waveguide arms 604. The interleaved-chirped waveguide grating router (WGR) 601 has waveguide arms 604 that are divided into groups of three arms 605. In each group of three waveguides 605, every third arm is given an additional path length of $\lambda_c/3$, while the other two waveguide grating arms in each group remain the same length as for a conventional waveguide grating router. The interleave-chirped WGR 601 may be of the type described in the previously referenced Doerr patent application.

Each path between arm r and one of the arms nx comprise a CW lasing cavity for one of the n wavelength lasers. With reference to FIG. 5, the length L is the length of the shortest waveguide in the grating arms 405. Returning to FIG. 6. the arms r and nx terminate in HR surfaces 609 and 616. Powering an amplifier A in arm nx, via a lead 608, turns on the associated wavelength $\lambda.n$. Ports p and p-bar output a laser signal and its complement, respectively, via an AR surface 617. For optimal performance all arms x, y, and z should be the same length. Due to possible 4-wave mixing in the common waveguide r, arm r should be kept as short as possible.

In operation, a portion of each of the n laser wavelengths is coupled from path r, via star coupler 603, to each of the three waveguides in each group, e.g., 605. In the same manner as was discussed with respect to FIG. 5, the n wavelength signals from each of the n groups 605 are coupled to three of the interleaved chirp-created Brillouin zones 610–612. The resulting wavelengths in groups $\lambda_{1x}-\lambda_{nx}$; $\lambda_{1y}-\lambda_{ny}$; and $\lambda_{1z}-\lambda_{nz}$, are outputted over the associated waveguides groups 1x–nx, 1y–ny, 1z–nz, respectively. Under control of signal 608, amplifier A amplifies the wavelength signals $\lambda_{1x}-\lambda_{nx}$ on waveguides 1x–nx. The associated phase shifter P and amplifier A set the phase and magnitude, respectively, of each wavelength on waveguides 1y–ny and 1z–nz, under control of control signals 614 and 615, respectively. The HR surface 616 reflects these wavelengths back through the waveguides 1x–nx, 1y–ny, and 1z–nz; star coupler 602; waveguides 604; to star coupler 603. At star coupler 603, a portion of the wavelength signals $\lambda_{1x}-\lambda_{nx}$; $\lambda_{1y}-\lambda_{ny}$; and $\lambda_{1z}-\lambda_{nz}$ go to path r to support laser operation and to one or both of the output ports p and p-bar. The phase vs. power output equations for ports p and p-bar are identical to the those of the above single wavelength device as shown in FIG. 2.

Advantageously, the device of FIG. 6, provides many individually modulated wavelength channels yet is very compact in size. Using phase shift as the modulation mechanism not only allows for modulation at high speed with low current (or voltage), but by choosing the proper modulation waveform, the chirp of the outgoing signal may be tailored as well. For example, the chirp may be eliminated by driving the complementary phase shifter in a push-pull manner or tailored to any degree by asymmetrically driving each phase shifter, in an appropriate manner, to obtain opposite signs in the phase value. Another advantage of this device of FIG. 6, is that because it is used in reflective mode, the optical signal passes through each phase shifter twice. Therefore the phase shifters P may be half the length or run at half the voltage (or current), as compared to using phase shifter P in the arms 620 and 621. For a similar reason, the amplifiers A are used in arms 1y–ny and 1z–nz rather than in the arms 620 and 621.

In much the same manner as that described in FIG. 3, in an alternate embodiment of the invention of FIG. 6, we may eliminate either the y set 622 or the z set 623 of n waveguides, and the associated amplifiers A and phase shifter PS, and the associated output port p or p-bar. Such an embodiment would, however, be less efficient than that of FIG. 6.

Many of the elements of the present invention may be implemented as described in the previously referenced Doerr patent application. Additionally, while the arrangement of FIG. 6, has been described as using WGR 601, it should be understood that other types of angular dispersive elements may be utilized. For example, the unit 601 can be an angular dispersive element implemented using a virtually imaged phase array (VIPA) as described in the article by M. Shirasaki entitled "Large angular dispersion by a virtually imaged phase array and its application to a wavelength demultiplexer", OPTICS LETTERS, Vol. 21, No. 5, March 1996. Another type of angular dispersive element, which may be used, is a well-known reflecting grating.

Thus, what has been described is merely illustrative of the application of the principles of the present invention. Hence, other arrangements can be implemented by those skilled in the art without departing from the spirit and scope of the present invention.

What is claimed is:

1. A multichannel laser comprising
a waveguide grating router including
   a first star coupler,
   a second star coupler, and
   three interleaved sets of m waveguide grating arms, where m is a number greater than one, interconnecting to a first side of the first and second star couplers, and producing n wavelengths in the multichannel laser, where n is the number greater than one;
a second side of said first coupler including
   a first connection to a reflecting surface, and
   a second connection to an output port;
a second side of said second coupler including
   a first group of n connected waveguides, each of the n waveguides connected through an optical amplifier to a reflecting surface,
   a second group of n connected waveguides, each of the n waveguides connected through an optical amplifier and a controllable phase shifter to a reflecting surface;
   wherein a laser cavity formed for each of n lasers includes one of the first group of waveguides, the first and second couplers, the group of m waveguides, and the first connection of said first coupler; and
   wherein the optical amplifier and phase shifter in each one of the second group of n connected waveguides control the magnitude of each of the n laser signals appearing at the output port.

2. The multichannel laser of claim 1 wherein the optical amplifier and phase shifter in each one of the second group of n connected waveguides and an associated one of the n lasers form an interferometric modulator to control the magnitude of said each of the n laser signals appearing at the output port.

3. The multichannel laser transmitter of claim 1 wherein the second and third reflective terminations are part of the same reflective surface.

4. The multichannel laser of claim 1 wherein the second side of said second coupler further includes
   a third group of n connected waveguides, each connected through an optical amplifier and a controllable phase shifter to a reflecting termination; and wherein
   the optical amplifier and phase shifter in corresponding ones of the second and third groups of n connected waveguides control the magnitude of each of the n laser signals appearing at the output port.

5. The multichannel laser of claim 1 wherein the length of the first and second groups of n connected waveguides are substantially the same.

6. The multichannel laser of claim I wherein the first connection on the second side of said first coupler is made as short as possible.

7. The multichannel laser of claim 1 wherein a second side of said first coupler further includes
   a third connection to a second output port; and wherein
   the magnitude of each of n laser signals appearing at both the output and second output ports is controlled by a phase shift set in an associated phase shifter in the second group of n connected waveguides.

8. The multichannel laser of claim 3 wherein a second side of said first coupler further includes
   a third connection to a second output port; and wherein
   the magnitude of each of n laser signals appearing at both the output and second output ports is controlled by a phase shift set in both an associated phase shifter in the second and third groups of n connected waveguides.

9. The multichannel laser of claim 8 wherein the magnitude of each of n laser signals appearing at either the output port or the second output port can be independently set to zero when a $+\theta$ degree phase shift, where $\theta$ is an angle less than or equal to 90 degrees, is set in an associated one of the phase shifters in the second group of n connected waveguides and a $-\theta$ degree phase shift is set in an associated one of the phase shifters in the third group of n connected waveguides.

10. The multichannel laser of claim 8 wherein each of the n laser signals can be switched between the output and second output ports independently in response to a positive phase shift set in an associated one of the phase shifters in the second group of n connected waveguides and negative phase shift set in an associated one of the phase shifters in the third group of n connected waveguides.

11. The multichannel laser of claim 8 wherein each of the n laser signals can be have the same power at the output and second output ports independently in response to a positive phase shift set in an associated one of the phase shifters in the second group of n connected waveguides and negative phase shift set in an associated one of the phase shifters in the third group of n connected waveguides.

12. The multichannel laser of claim 1 wherein a number of the amplifiers in both the second and third groups of n connected waveguides can be independently turned on or off.

13. The multichannel laser of claim 1 wherein the phase shift of the phase shifters are independently controlled.

14. The multichannel laser of claim 1 wherein the length of the first, second and third groups of n connected waveguides is the same.

15. The multichannel laser of claim 1 wherein the chirp of the outputted signal can be controlled by driving an associated one of the phase shifters of each of the second and third groups in an appropriate manner.

16. A method of controlling an output of a multichannel laser comprising the steps of:
forming a waveguide grating router including
   a first star coupler,
   a second star coupler, and
   three interleaved sets of m waveguide grating arms, where m is a number greater than one, interconnecting to a first side of the first and second star couplers, and producing n wavelengths in the multichannel laser, where n is the number greater than one;
a second side of said first coupler including
   a first connection to a reflecting surface, and
   a second connection to an output port;
a second side of said second coupler including
   a first group of n connected waveguides, each of the n waveguides connected through an optical amplifier to a reflecting surface,
   a second group of n connected waveguides, each of the n waveguides connected through an optical amplifier and a controllable phase shifter to a reflecting surface;
forming a laser cavity for each of n lasers, each cavity including one of the first group of waveguides, the first and second couplers, the group of m waveguides, and the first connection of said first coupler; and controlling the optical amplifier and phase shifter in each one of the second group of n connected waveguides to control the magnitude of each of the n laser signals appearing at the output port.

17. The method of claim 16 further comprising the steps of:

providing a second output port via a third connection to the second side of said first coupler; and controlling the magnitude of each of n laser signals appearing at both the output and second output ports by controlling a phase shift set in an associated phase shifter in the second group of n connected waveguides.

18. The method of claim 16 further comprising the steps of providing a third group of n connected waveguides at the second side of said second coupler, each connected through an optical amplifier and a controllable phase shifter to a reflecting termination; and controlling the optical amplifier and phase shifter in correspon ding ones of the second and third groups of n connected waveguides thereby controlling the magnitude of each of the n laser signals appearing at the output port.

19. The method of claim 18 further comprising the steps of;

providing a second output port via a third connection to the second side of said first coupler; and controlling the magnitude of each of n laser signals appearing at both the output and second output ports by controlling a phase shift set in both an associated phase shifter in the second and third groups of n connected waveguides.

* * * * *